US008760572B2

(12) United States Patent
Bilgin et al.

(10) Patent No.: US 8,760,572 B2
(45) Date of Patent: Jun. 24, 2014

(54) METHOD FOR EXPLOITING STRUCTURE IN SPARSE DOMAIN FOR MAGNETIC RESONANCE IMAGE RECONSTRUCTION (75) Inventors: Ali Bilgin, Tucson, AZ (US); Yookyung Kim, Tucson, AZ (US); Mariappan S. Nadar, Plainsboro, NJ (US)

(73) Assignees: Siemens Aktiengesellschaft, Munich (DE); The University of Arizona, Tuscon, AZ (US)

( * ) Notice: Subject to any disclaimer, the term of this patent is extended or adjusted under 35 U.S.C. 154(b) by 795 days.

(21) Appl. No.: 12/942,427

(22) Filed: Nov. 9, 2010

(65) Prior Publication Data

US 2011/0116724 A1 May 19, 2011

Related U.S. Application Data (60) Provisional application No. 61/281,608, filed on Nov. 19, 2009.

(51) Int. Cl.
*H04N 7/12* (2006.01)
*G06K 9/00* (2006.01)

(52) U.S. Cl.
USPC ........................................ 348/424.1; 382/128

(58) Field of Classification Search
None
See application file for complete search history.

(56) References Cited

U.S. PATENT DOCUMENTS

| 5,799,112 | A  | * | 8/1998  | de Queiroz et al. ........... 382/254 |
|-----------|----|---|---------|--------------------------------------|
| 6,748,118 | B1 | * | 6/2004  | Acharya et al. ............... 382/240 |
| 6,937,659 | B1 | * | 8/2005  | Nguyen et al. ........... 375/240.19 |
| 6,961,472 | B1 | * | 11/2005 | Acharya et al. ............... 382/240 |
| 2002/0064231 | A1 | * | 5/2002  | Felts et al. ............... 375/240.21 |
| 2003/0190080 | A1 | * | 10/2003 | Simard et al. ................ 382/238 |
| 2009/0324116 | A1 | * | 12/2009 | Takada ......................... 382/246 |
| 2010/0246920 | A1 | * | 9/2010  | Vaswani ........................ 382/131 |
| 2011/0090394 | A1 | * | 4/2011  | Tian et al. .................. 348/424.1 |

OTHER PUBLICATIONS

Lustig, Michael. Donoho, David. Pauly, John M. "Sparse MRI: The Application of Compressed Sensing for Rapid MR Imaging." Oct. 29, 2007, Wiley-Liss, Inc. 14 pages.*
Miosso, Cristiano Jacques. Borries, Ricardo Von. Argaez, M. Velazquez, L. Quintero, C. Potes, C. M. "Compressive Sensing Reconstruction with Prior Information by Iteratively Reweighted Least-Squares," IEEE Transactions on Signal Processing,vol. 57, Issue 6. Jun. 28, 2009, 8 pages.*
La, Chinh. Do, Minh N. "Signal Reconstruction Using Sparse Tree Representations," SPIE Proceedings, vol. 5914, Sep. 17, 2005, 12 pages.*

(Continued)

*Primary Examiner* — Jason M Repko
*Assistant Examiner* — Ryan P Potts (57) ABSTRACT

A method for constructing an image includes acquiring image data in a first domain. The acquired image data is transformed from the first domain into a second domain in which the acquired image data exhibits a high degree of sparsity. An initial set of transform coefficients is approximated for transforming the image data from the second domain into a third domain in which the image may be displayed. The approximated initial set of transform coefficients is updated based on a weighing of where substantial transform coefficients are likely to be located relative to the initial set of transform coefficients. An image is constructed in the third domain based on the updated set of transform coefficients. The constructed image is displayed.

20 Claims, 3 Drawing Sheets

(56) References Cited

OTHER PUBLICATIONS

Borries, R. Von. Miosso, C. J. Potes, C. "Compressed Sensing Using Prior Information," 2nd IEEE International Workshop on Computational Advances in Multi-Sensor Adaptive Processing 2007, Dec. 14, 2007, 5 pages.*

Song, Jiayu. Liu, Qing H. Johnson, Allan G. Badea, Cristian T. "Sparseness Prior Based Iterative Image Reconstruction for Retrospectively Gated Cardiac Micro-Ct," Medcal Physics, vol. 34, Issue 11, Oct. 26, 2007, 8 pages.*

Shapiro, Jerome M. "Embedded Image Coding Using Zerotrees of Wavelet Coefficients," Dec. 12, 1993, IEEE Transactions on Signal Processing, vol. 41, No. 12, 18 pages.*

* cited by examiner

METHOD FOR EXPLOITING STRUCTURE IN SPARSE DOMAIN FOR MAGNETIC RESONANCE IMAGE RECONSTRUCTION

CROSS-REFERENCE TO RELATED APPLICATION

The present application is based on provisional application Ser. No. 61/281,608, filed Nov. 19, 2010, the entire contents of which are herein incorporated by reference.

BACKGROUND OF THE INVENTION

1. Technical Field

The present disclosure relates to image reconstruction and, more specifically, to compressed sensing reconstruction using context information.

2. Discussion of Related Art

In magnetic resonance imaging (MRI), internal structures of patients' bodies may be imaged by reconstructing magnetic resonance data. As the magnetic resonance data may be acquired in a sensing domain, for example, a Fourier domain, reconstruction of the acquired data may involve a transformation into an image domain, for example, using an inverse Fourier transformation.

Image acquisition may be performed under time-sensitive conditions to ensure that there is no movement of the subject during the image acquisition process. Thus, image acquisition may be performed while the patient refrains from moving. Often this requires the patient holding breath. Where the MRI study seeks to track motion such as cardiac motion, acquisition time might have to be especially short.

In light of this shortened acquisition time, it may be difficult to acquire data at the Nyquist rate to ensure sufficient sampling for ideal image reconstruction. Accordingly, performing accurate reconstruction with less than an ideal amount of data may be difficult. This difficulty in reconstructing an image under these conditions may be similar to trying to solve for a system of linear equations in which there are more unknown variables then there are equations. In such a case, there may be an infinite number of possible solutions.

Compressed sensing (CS) techniques have been developed to aid in reconstructing a signal using a sampling rate that is below the Nyquist sampling rate. These techniques exploit the observation that most practical signals of interest have sparse representations using a specific transform. Thus, for a given signal, there may exist a particular transformation space in which a majority of the transform coefficients are at or near zero. This transformation space may be referred to as the sparsity space. As these small coefficients may be assumed to be zero without significant loss of signal quality (the sparseness assumption), signal reconstruction may be approximated by determining only the limited set of large transform coefficients for the sparsity space. When dealing with image reconstruction of MRI signals, a wavelet transform space may serve as an effective sparsity space.

Accordingly, when using CS techniques, transform coefficients may be determined from limited available data by seeking a solution that maximizes sparsity while conforming to the available data. Thus, the signal is reconstructed by finding the sparsest solution from among the infinitely many candidates satisfying the available measurements.

While existing CS techniques may be helpful in reconstructing images from limited available data, new techniques are desired that can be used to produce reconstructed images with superior image quality and increased signal-to-noise ratios in less time than current CS techniques permit.

SUMMARY

A method for constructing an image includes acquiring image data in a first domain. The acquired image data is transformed from the first domain into a second domain in which the acquired image data exhibits a high degree of sparsity. An initial set of transform coefficients is approximated for transforming the image data from the second domain into a third domain in which the image may be displayed. The approximated initial set of transform coefficients is updated based on a weighing of where substantial transform coefficients are likely to be located relative to the initial set of transform coefficients. An image is constructed in the third domain based on the updated set of transform coefficients. The constructed image is displayed.

The first domain may be a sensing domain, the second domain may be a sparsity domain, and the third domain may be an image domain. The sparsity domain may be a wavelet transform domain. Alternatively, the sparsity domain may be a total-variation domain.

Approximating the initial set of transform coefficients may be performed using compressed sensing.

Constructing the image in the third domain may include performing an inverse wavelet transform using the updated set of transform coefficients.

The weighing of where substantial transform coefficients are likely to be located may be based on a prior knowledge pertaining to proximal relationships of substantial transform coefficients within other image data expressed within the same second domain. The proximal relationships may include a diagonal orientation along subbands. The weighing of where substantial transform coefficients are likely to be located may be based on context information.

The image data may be acquired using a magnetic resonance imager. Alternatively, the image data may be acquired using a computed tomography imager.

Approximating the initial set of transform coefficients may include performing CS reconstruction. Performing CS reconstruction may be performed in conjunction with Iterative Hard Thresholding (IHT), Orthogonal Matching Pursuit (OMP), Iteratively Reweighted Least Squares (IRLS), or reweighted $l_1$ minimization (RL1).

A method for constructing an image includes acquiring image data in a sensing domain, wherein the acquired image data is insufficient to construct an image using a Nyquist technique. The acquired image data is transformed from the sensing domain into a wavelet transform domain in which the acquired image data exhibits a high degree of sparsity. An image is constructed in the image domain based on the acquired image data transformed into the wavelet transform domain using compressed sensing (CS) reconstruction. Image construction may be influenced by a maximization of sparsity of the image data in the wavelet transform domain and a priori knowledge about relative locations of significant transform coefficients for the image data within the wavelet transform domain. The constructed image is displayed.

The a priori knowledge about relative locations of significant transform coefficients may include knowledge of proximal relationships along diagonal orientation of subbands.

The image data may be acquired using a magnetic resonance imager or a computed tomography imager.

CS reconstruction may be performed in conjunction with Iterative Hard Thresholding (IHT), Orthogonal Matching Pursuit (OMP), Iteratively Reweighted Least Squares (IRLS), or reweighted $l_1$ minimization (RL1).

A computer system includes a processor and a non-transitory, tangible, program storage medium, readable by the computer system, embodying a program of instructions executable by the processor to perform method steps for constructing an image. The method includes acquiring image data in a sensing domain, transforming the acquired image data from the sensing domain into a wavelet transform domain in which the acquired image data exhibits a high degree of sparsity, approximating an initial set of transform coefficients for transforming the image data from the wavelet transform domain into an image domain in which the image may be displayed by performing compressed sensing (CS) reconstruction, updating the approximated initial set of transform coefficients based on a weighing of where substantial transform coefficients are likely to be located relative to the initial set of transform coefficients, constructing an image in the image domain based on the updated set of transform coefficients, and displaying the constructed image.

Approximating the initial set of transform coefficients may be performed using compressed sensing.

The weighing of where substantial transform coefficients are likely to be located may be based on a prior knowledge pertaining to proximal relationships of substantial transform coefficients within other image data expressed within the wavelet transform domain.

The image data may be acquired using a magnetic resonance imager.

CS reconstruction may be performed in conjunction with Iterative Hard Thresholding (IHT), Orthogonal Matching Pursuit (OMP), Iteratively Reweighted Least Squares (IRLS), or reweighted $l_1$ minimization (RL1).

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention seek to provide approaches for reconstructing images from limited available data while maintaining high image quality and high signal-to-noise ratios in a computationally efficient manner. For example, exemplary embodiments of the present invention may be used to construct high quality MR images from limited data such as data that has been acquired under time-sensitive conditions. Exemplary embodiments of the present invention should not be seen as limited to reconstructing images from MR image data and may easily be applied to other forms of image reconstruction such as that which uses computed tomography (CT) data, hyperspectral imaging, and other forms of image reconstruction.

These goals may be accomplished, for example, by not only finding the sparsest solution from among the infinitely many candidates satisfying the available measurements, as described above, but by imposing additional constraints that are based on a priori knowledge about the relative locations in which the set of large transform coefficients tend to present themselves given the particular sparsity space in use. For example, where the wavelet transform space is used as the sparsity space, as is sometimes the case when dealing with MR images, exemplary embodiments of the present invention recognize that the large transform coefficients tend to be located proximately to other large transforms and it is less likely that large transform coefficients would exist in isolation. Thus, exemplary embodiments of the present invention may use this a priori knowledge to impose additional constraints on the set of possible solutions so that the identified set of transform coefficients maximizes a quantification of proximity of large coefficients while maximizing sparsity. By imposing such a constraint, the identified set of transform coefficients may then be used to produce reconstructed images with superior image quality and increased signal-to-noise ratios in less time than current CS techniques permit.

While any manner of quantifying proximity of large coefficients may be used to exploit the a priori knowledge of the dependencies between large coefficients according to exemplary embodiments of the present invention, the present disclosure describes several such approaches by way of example. The invention should not be understood to be limited to these examples. In one such example, may be assumed that significant wavelet coefficients tend to present in hierarchical structures such as a connected tree structure.

Accordingly, exemplary embodiments of the present invention may utilize a system of weighing coefficients according to orientation. Context information of a wavelet coefficient may thus be represented by a weighted sum of highly correlated coefficients. This context information may then be used in performing wavelet-based CS reconstruction.

Context information may be applied to various forms of CS reconstruction, for example, context information may be used in conjunction with Iterative Hard Thresholding (IHT), Orthogonal Matching Pursuit (OMP), Iteratively Reweighted Least Squares (IRLS), and/or reweighted $l_1$ minimization (RL1). These approaches may then be refined through iterative implementation, wherein, at each iteration, local context information is inferred from the reconstructed wavelet coefficients and used, instead of the current solution, in the decision step to find the next solution. Wavelet decomposition may be performed, for example, by applying a series of low-pass filter (LPF) and high-pass filter (HPF) followed by sub-sampling. Decomposition may be used to generate four oriented subbands (LL, LH, HL, and HH) and a hierarchical quadtree structure of wavelet coefficients. The coefficients in each subband may have four children coefficients in the subband at the finer scale and same orientation. This hierarchical relation is called a parent/child relation, which is illustrated as the arrows in FIG. 1. Similarly, the concepts of descendants and ancestors may be defined.

The significantly large coefficients may tend to have a connected tree structure, and may tend to be aggregated along several branches. The wavelet transform, which represents piecewise continuous and smooth signals, allocates large amplitude coefficients to regions containing sharp transitions. These discontinuities may generate a group of nonzero coefficients in a cone shape, which may be called a wavelet footprint. Therefore, even a single significant coefficient may suggest a series of nonzero coefficients at different scales due to the existence of edges or texture. Wavelet coefficient amplitudes may be correlated across scales. If a child coefficient is significant, the parent coefficient at the coarser scale may also be significant. Similarly, according to the concept of zerotree, if a coefficient is a zero-quantized coefficient, then all of its descendant coefficients are likely to be zero-quantized as well. These relationships, and others, between the significant coefficients may be exploited, according to exemplary embodiments of the present invention, to suggest where additional significant coefficients are likely to be found based on one or more significant coefficients that have already been found, and these suggestions may be used to further focus CS reconstruction to provide better results based on less information.

Figure 1:
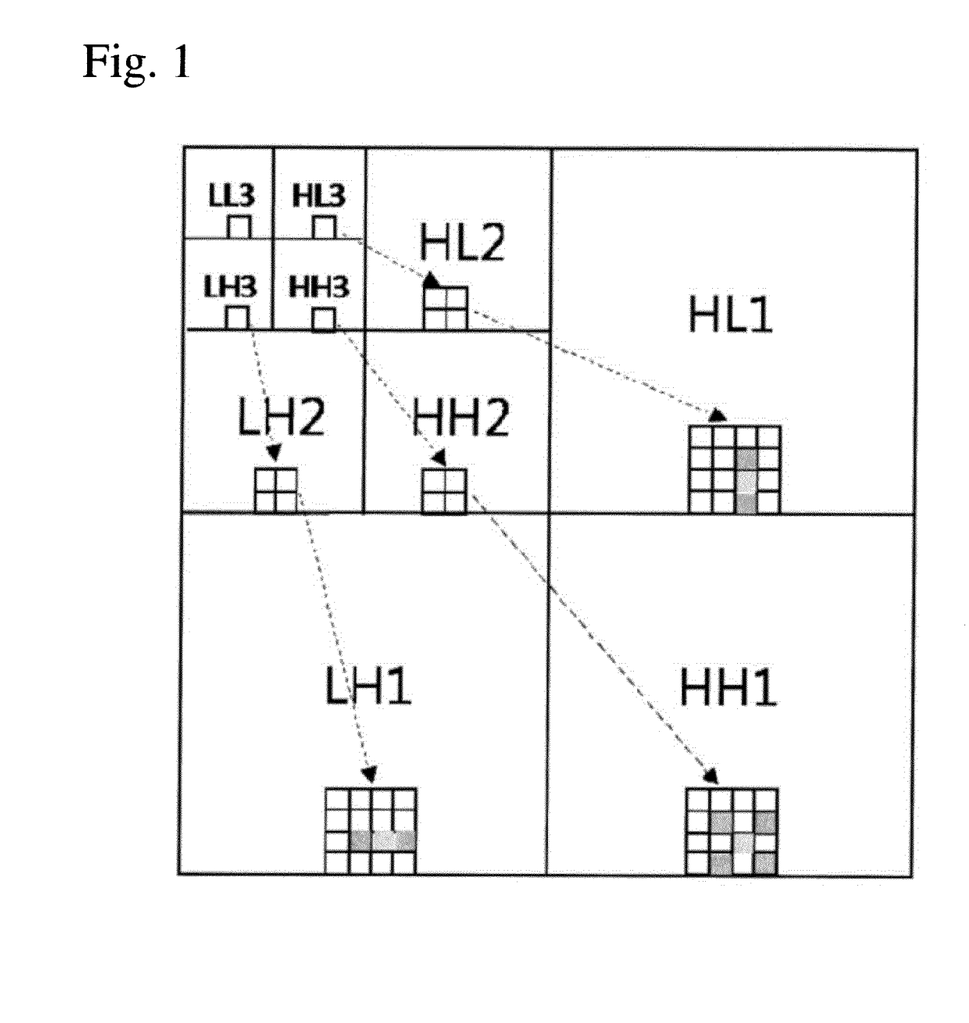
FIG. 1 is a diagram illustrating wavelet decomposition used according to exemplary embodiments of the present invention.

FIG. 1 is a diagram illustrating wavelet decomposition used according to exemplary embodiments of the present invention. Here, quadtree decomposed blocks represent subbands and the arrows show the relationship from parent to child. Centered pixel denotes a reference coefficient and adjacent pixels denote the highly correlated neighbor coefficients according to the orientations.

For example, an image with size $2^n \times 2^n$ that is decomposed S times by a discrete orthonormal wavelet transform may be considered. Here, $x^{s,o}(i, j)$ may be used to denote the wavelet coefficient having the spatial location $(i,j)$, $1 \leq i, j \leq 2^{n-s}$ at scale s, s=1, 2, ..., S, and orientation o, o={LH, LH, HL, HH}, where S is the coarsest scale, and the size of the subband at scale s is $2^{n-s} \times 2^{n-s}$. If a coefficient $x^{s,o}(i, j)$ is a child coefficient, the parent coefficient $x_p^{s,o}(i, j)$ is the coefficient corresponding to the same spatial location at the coarser scale, defined by $x_p^{s,o}(i, j) = x^{s+1,o}(\lfloor i/2 \rfloor, \lfloor j/2 \rfloor)$. In the same subband, a coefficient, except for boundary coefficients, has the eight adjacent neighbor coefficients. The amplitudes of neighbor coefficients are correlated with each other.

Depending on the orientation, coefficients may have different directional properties. LH, HL and HH subbands may be more sensitive to horizontal, vertical, and diagonal edges, respectively. In particular, when the direction of edges matches the subband's orientation, significant coefficients may be clustered along that direction. For each orientation, the highly correlated neighbors $x_n^{s,o}(i,j)$ of the coefficient $x^{s,o}(i,j)$ may be defined along the directions: $x^{s,o}(i\pm1, j)$, o=LH; $x^{s,o}(i,j\pm1)$, o=HL; and $x^{s,o}(i\pm1,j\pm1)$, o=HH, as illustrated in FIG. 1. Wavelet Domain Context Information (WDCI) may include dependencies between parent and child coefficients, the tree structure from ancestors to descendants, and the correlation in a neighborhood depending on the orientations.

Accordingly, exemplary embodiments of the present invention may exploit wavelet domain context information (WDCI) in performing compressed sensing (CS). According to CS theory, where a signal is observed by a linear measurement matrix at significantly reduced resolution, the original signal may still be reconstructed using nonlinear algorithms. For this reason, CS theory may be used to develop signal recovery techniques. Such techniques may be roughly divided into two categories, convex relaxation and greedy pursuits. In convex relaxation, the sparseness constraint may be relaxed to $l_1$ minimization. By solving the linear convex optimization problem, signals may be reconstructed. In greedy pursuits, reconstruction may be performed by building an efficient approximation of a signal in an iterative fashion. For example, OMP and Compressive Sampling Matching Pursuit (CoSaMP) may be included.

According to iterative hard thresholding (IHT) techniques, the number of nonzero coefficients is restricted to be less than a certain number M, where:

$$\min_x \|b-Ax\|_2^2 \; s.t. \|x\|_0 \leq M \quad (1)$$

IHT may according be used to solve for the non-zero coefficients through the following iterative equation:

$$x^{n+1} = H_M(x^n + \mu A^H(b-Ax^n)) \quad (2)$$

where $H_M$ is a nonlinear operation that retains the M largest coefficients and x is initialized to zero. The superscript n is the iteration index and μ is the step size.

Where the wavelet transform is used as the sparsity transform and the Fourier transform is used to acquire linear measurements, x represents the wavelet coefficients of the object being imaged and the image is obtained by the inverse wavelet transform of x. Here, b denotes Fourier measurements having much lower dimension than x. A is a matrix that performs consecutive applications of an inverse wavelet transform and a forward Fourier transform. When this technique is applied to the CS reconstruction problem, the cost function is not increased and instead converges within a fixed number of iterations under certain conditions.

Most images of interest may be approximately represented by a few significant wavelet coefficients. The CS problem may thus be viewed as the procedure to find both the locations and magnitudes of those significant coefficients. Two sets of coefficients are important in IHT recovery. Both the coefficients corresponding to the assumed locations as well as the magnitudes of the retained coefficients may be used.

Context information w may be introduced into the IHT framework as follows.

$$w = a|y_c| + (1-a)(|y_p|/2 + \Sigma_i |y_{n,i}|/2) \quad (3)$$

where the estimates of wavelet coefficients, $y_c$, at iteration n is such that $y_c = x^n + \mu A^H(b-Ax^n)$. Vector $y_p$ represents the parent coefficients of the coefficients $y_c$, and $y_{n,i}$ denotes the neighbor coefficients of $y_c$ in order i. The correlation between wavelet coefficients can be inferred from the weighted sum of the coefficient itself and its highly correlated coefficients. Exemplary embodiments of the present invention may utilize a technique, referred to as WDCI-IHT, in which M coefficients are chosen based on this context information. The weight a adjusts the relative importance between the reference coefficient and the context information.

Neighbor coefficients may be divided into the oriented groups along the horizontal, vertical, and diagonal directions. The 2D orthonormal wavelet may have ambiguity between the ±45° orientations in the HH subbands. Therefore, the highly correlated neighbor coefficients are chosen from the orientation having the largest sum. The LPF and HPF, the LH and HL subbands are likely to preserve the horizontal and vertical edges, respectively. Thus, in LH and HL subbands, when the sum of the neighbor coefficients is compared in the horizontal and vertical directions, additional weight may be placed on the sum of neighbor coefficients in the direction corresponding with the subband orientation.

Orthogonal matching pursuit (OMP) is a variation of matching pursuit (MP) algorithms, which may be computationally efficient in approximating a signal given undersampled measurements. Reconstruction of a signal may require finding associated column vectors of the CS matrix, called atoms, related to measurements. MP techniques may compute an M-term approximation of a signal with M atoms selected from a redundant dictionary. At each iteration, one atom that is most strongly correlated with the remaining part of the input signal may be selected. OMP may orthogonalize the selected atom with respect to the previously selected atoms, for example, using the Gram-Schmidt approach. The projection of a signal to the restricted subspace composed of the selected atoms may represent the near optimal approximation of a signal. OMP approaches may iteratively perform the following procedures until selecting M number of atoms.

$$i_{max} = \operatorname*{argmax}_{i} |\langle b - A_{S_n} x_n, a_i \rangle / \|a_i\|_2^2 | \quad (4)$$
$$i = 1, \ldots, N$$

$$S_n = S_{n-1} \cup i_{max} \quad (5)$$

$$x_n = A_{S_n}^H b \quad (6)$$

where $\langle \cdot, \cdot \rangle$ means inner product, subscript n and i are the iteration index and the column index of CS matrix A, respectively. Initial approximation x, and initial column index set $S_0$ may be set to zero. The approximation of a signal is computed by the orthogonal projection of measurements onto the subspace constructed by the selected atoms.

As described above with respect to WDCI, significant wavelet coefficients may be represented in a connected tree and may likely be clustered in several branches of the tree. The selected atoms in OMP may be related to the spatial locations of significant coefficients. Thus, approaches in accordance with exemplary embodiments of the present invention, for example, WDCI-OMP, may select a new atom among the atoms corresponding to the ancestors, descendants, or neighbors of the coefficients corresponding to the already selected atoms. This approach may be used to ensure that significant wavelet coefficients form a connected tree and the relation between neighbor coefficients corresponding with subband orientation is emphasized.

Exemplary embodiments of the present invention may apply iteratively reweighted least squares (IRLS) to the space problem discussed above. Here, the weighted $l_2$ minimization problem may be solved for a starting weight matrix with the identity matrix such that $W^{(0)}=I$. Then the solution may be used to define a new weight. These two steps may be repeated for a fixed number of iterations.

$$x^{(n+1)} = \arg\min_{x} W^{(n)} \|b - Ax\|_2^2 = (AW^{(n)} A^T)^{-1} A^T W^{(n)} b \quad (7)$$

$$w_i^{(n+1)} = 1 / \sqrt{|x_i^{(n)}|^2 + \varepsilon_n^2} \quad (8)$$
$$i = 1, \ldots, N$$

where superscript n and i are iteration and element indices, respectively. Weight matrix W is the diagonal matrix having a weight $w_i$ on $i^{th}$ diagonal entry. Constant $\epsilon_n$ may be a small value to avoid dividing by zero and may adaptively decrease as iteration proceeds.

According to WDCI, wavelet coefficients may be highly correlated with their neighbor and parent coefficients. Accordingly, exemplary embodiments of the present invention may introduce a WDCI-IRLS approach that utilizes a new weight based on the context information and uses that weight in the next weighted $l_2$ minimization.

$$w_i^{(n+1)} = 1 / \sqrt{\left(a|x_i^{(n)}| + b\sum_{k}^{N_k} |x_{i,n,k}^{(n)}| + cx_{i,p}^{(n)}\right)^2 + \varepsilon_n^2} \quad i = 1, \ldots, N \quad (9)$$

where coefficient $x_{i,n,k}^{(n)}$ represents the neighbor of the reference coefficient $x_i^{(n)}$. Subscript k denotes element index among the neighbor coefficients, and $N_k$ represents the total number of neighbors of $x_i^{(n)}$. Here, the parent coefficient of $x_i^{(n)}$ is denoted by $x_{i,p}^{(n)}$. The relative importance of these coefficients may be scaled by the constant weights a, b, and c. The sum of the reference coefficient, its neighbors, and its parent may be defined as a new weight.

Solving the reweighted $l_1$ minimization problem instead of the $l_0$ minimization problem may provide for more accurate reconstruction results compared to unweighted $l_1$ minimization. Beginning with a weight w=1, the RL1 algorithm solves the weighted $l_1$ minimization problem and calculates a new weight using the solution. The new weight may be set to be an inverse of the solution. When the locations of nonzero coefficients are correctly estimated, the weighted $l_1$ norm problem may act similar to the $l_0$ norm problem. A signal may then be reconstructed, for example, by repeating the following algorithm for a fixed number of iterations.

$$x^{(n)} = \arg\min_{x} \sum_{i=1} w_i |x_i| \text{ such that } b = Ax \quad (10)$$

$$w_i^{(n+1)} = 1 / |x_i^{(n)} + \varepsilon| \quad (11)$$

where superscript n and i are iteration and element indices, respectively. Constant $\epsilon$ is a small value to avoid dividing by zero.

Similar to WDCI-IRLS, exemplary embodiments of the present invention may utilize a WDCI-RL1 technique which computes a new weight based on the context information as an inverse of the weighted sum of the reference coefficient, its neighbors, and its parent.

$$w_i^{(n+1)} = 1 / \left(a|x_i^{(n)}| + b\sum_{k}^{N_k} |x_{i,n,k}^{(n)}| + c|x_{i,p}^{(n)}| + \varepsilon\right) i = 1, \ldots, N \quad (12)$$

Accordingly, exemplary embodiments of the present invention may exploit correlations between neighbor coefficient amplitudes, as well as the correlations across scales. WDCI may be inferred from the weighted sum of a coefficient, its parent, and its neighbor coefficients. Similarly, the reconstructed wavelet coefficients may be constrained to have a connected tree structure. Such approaches may be flexibly applied to various CS reconstruction algorithms, including IHT, OMP, IRLS, and RL1. Superior reconstruction may result and high SNR values may be achieved using exemplary embodiments of the present invention and reconstruction time and the number of measurements required for robust recovery of the original signal may be significantly reduced.

Figure 2:
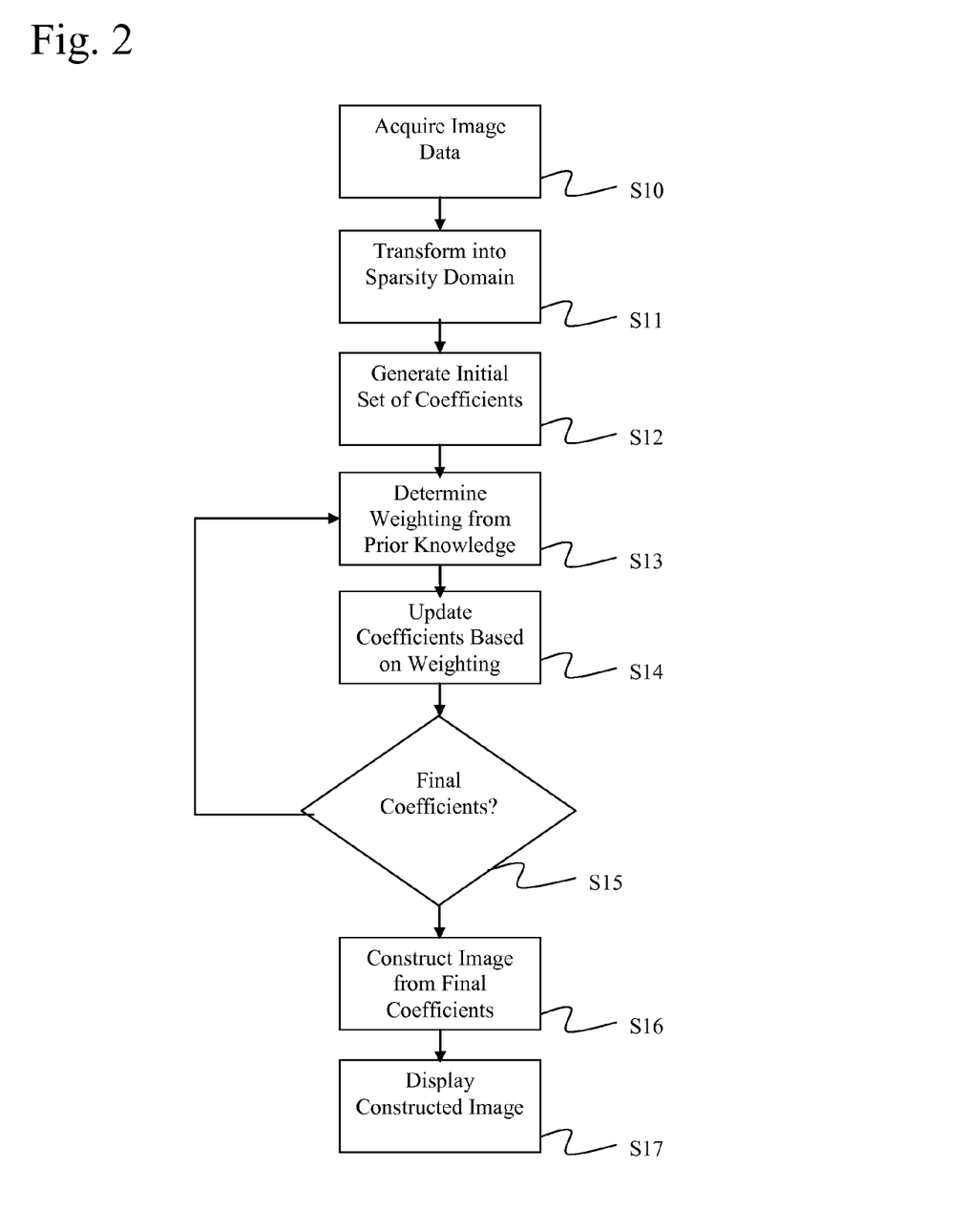
FIG. 2 is a flow chart illustrating a method for constructing an image according to an exemplary embodiment of the present invention.

FIG. 2 is a flow chart illustrating a method for constructing an image according to an exemplary embodiment of the present invention. First, image data may be acquired (Step S10). Image data may be acquired, for example, using a magnetic resonance (MR) imager. The image data may be acquired in the sensing domain. The acquired image data may be insufficient for producing a clear image under conventional imaging approaches such as those that utilize Nyquist methods.

The acquired image data may then be transformed into a sparsity domain (Step S11). The sparsity domain may be a domain in which the image data is known to be sparse within. For example, where the image data is MR image data, the wavelet domain may be used as the sparsity domain as MRIs of anatomical structures tend to exhibit sparsity within this domain. Other sparsity domains may be used depending on the nature of the image reconstruction being performed. For example, a total-variation (TV) domain may be used as the sparsity domain as TV may also exhibit dependence among neighboring coefficients. This transformation may be performed either in one step or may be performed with intervening transformative steps. For example, the acquired image data may first be transformed into an image domain using an inverse-Fourier transform and then transformed into the wavelet domain using a wavelet transform. Once the image data has been transformed into the sparsity domain (Step S11). An initial set of coefficients may be generated (Step S12). Generation of the initial set of coefficients may be performed, for example, using compression sensing (CS) techniques such as IHT, OMP, IRLS, RL1, etc. A recursive process of coefficient refinement may then be performed to find a final set of coefficients. This recursive process may include determining a weighting of where significant coefficients are likely to be found (Step S13). As the image data is understood to be sparse in the sparsity domain, most coefficients are zero or near zero, and thus may be approximated as being zero. Occasional coefficients are non-zero and are thus significant. It is these significant coefficients which exemplary embodiments of the present invention seek to identify. The weighting thus aids in the finding of significant coefficients by their proximity to other significant coefficients. Prior knowledge as to the spatial relationships of significant coefficients may be used to determine proper weighting. This prior knowledge may be, in its most simple form, that significant coefficients are likely to appear close to other significant coefficients. Prior knowledge may also be an understanding that when decomposed, for example, using wavelet decomposition as shown in FIG. 1, neighbor significant coefficients may tend to exist along diagonals from reference significant coefficients.

The coefficients may then be updated based on the weighing (Step S14). Updating the coefficients may include repeating the one or more CS techniques upon the weighted image data so that CS is biased towards the finding of significant coefficients at locations proximal to determined significant coefficients. This recursive process of determining weighing (Step S13) and updating coefficients based on the weighing (Step S14) may be repeated for a desired number of times until final coefficients have been generated (Step S15). The number of iterations may be predetermined or iteration may continue until predetermined criteria is met, for example, until subsequent iterations no longer produce a meaningful change to the coefficients.

Once final coefficients have been obtained, an image may be constructed from the final coefficients (Step S16). Construction of the image may include performing an inverse wavelet transform using the final coefficients as transform coefficients. The constructed image may then be stored for later use and/or displayed (Step S17).

Figure 3:
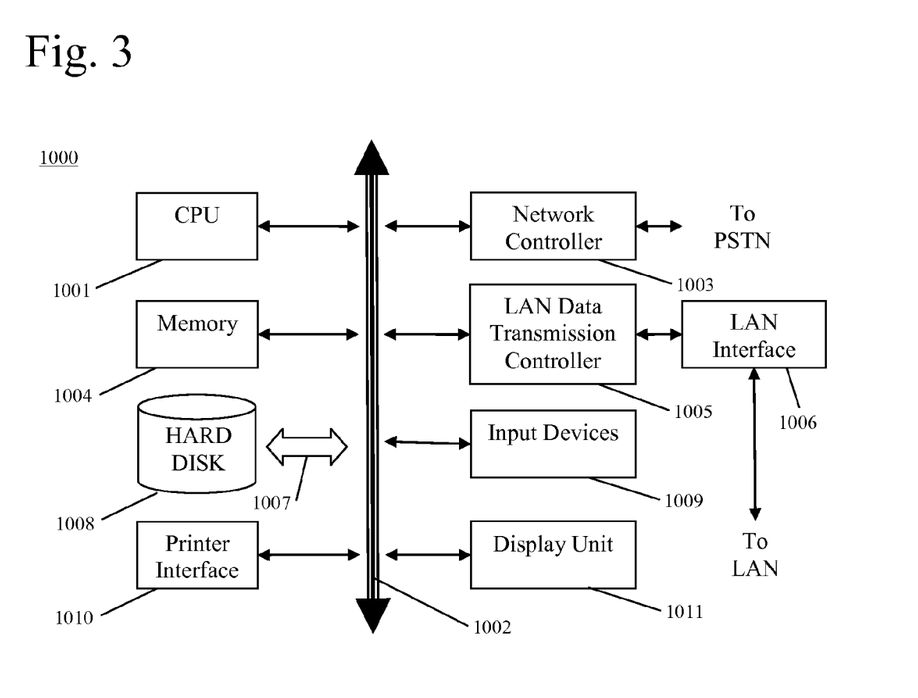
FIG. 3 shows an example of a computer system capable of implementing the method and apparatus according to embodiments of the present disclosure.

FIG. 3 shows an example of a computer system which may implement a method and system of the present disclosure. The system and method of the present disclosure may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for constructing an image, comprising:
   acquiring image data in a first domain;
   transforming the acquired image data from the first domain into a second domain in which the acquired image data exhibits a higher degree of sparsity than exhibited in the first domain;
   approximating an initial set of transform coefficients for transforming the acquired image data from the second domain into a third domain in which the image may be displayed;
   updating the approximated initial set of transform coefficients based on context information pertaining to the approximate initial set of transform coefficients;
   constructing an image in the third domain based on the updated set of transform coefficients; and
   displaying the constructed image,
   wherein the context information includes parent coefficients of the initial set of transform coefficients that has already been found within the image data in the second domain and a weighted sum of neighbor coefficients proximate to the initial set of transform coefficients that has already been found within the image data in the second domain, and
   wherein for each initial transform coefficient that has already been found, the parent coefficient is weighed equally, within the context information, with the sum of neighbor coefficients.

2. The method of claim 1, wherein the first domain is a sensing domain, the second domain is a sparsity domain, and the third domain is an image domain.

3. The method of claim 2, wherein the sparsity domain is a wavelet transform domain.

4. The method of claim 2, wherein the sparsity domain is a total-variation domain.

5. The method of claim 1, wherein approximating the initial set of transform coefficients is performed using compressed sensing.

6. The method of claim 1, wherein constructing the image in the third domain includes performing an inverse wavelet transform using the updated set of transform coefficients.

7. The method of claim 1, wherein proximity, for determining the locations proximate to where initial transform coefficients have already been found, is measured along a diagonal orientation along subbands resulting from a decomposition of wavelet coefficients.

8. The method of claim 1, wherein a weighing of where additional transform coefficients are likely to be located is based on the context information.

9. The method of claim 1, wherein the acquired image data is acquired using a magnetic resonance imager.

10. The method of claim 1, wherein the acquired image data is acquired using a computed tomography imager.

11. The method of claim 1, wherein approximating an initial set of transform coefficients includes performing compressed sensing (CS) reconstruction.

12. The method of claim 11, wherein performing compressed sensing (CS) reconstruction is performed in conjunction with Iterative Hard Thresholding (IHT), Orthogonal Matching Pursuit (OMP), Iteratively Reweighted Least Squares (IRLS), or reweighted $l_1$ minimization (RL1).

13. A method for constructing an image, comprising:
acquiring image data in a sensing domain, wherein the acquired image data is insufficient to construct an image using a Nyquist technique;
transforming the acquired image data from the sensing domain into a wavelet transform domain in which the acquired image data exhibits a higher degree of sparsity than exhibited in the sensing domain; and
constructing an image in an image domain based on the acquired image data transformed into the wavelet transform domain using compressed sensing (CS) reconstruction, wherein image construction is influenced by a maximization of sparsity of the acquired image data in the wavelet transform domain and a priori knowledge about locations of additional transform coefficients for the acquired image data within the wavelet transform domain; and
displaying the constructed image,
wherein said a priori knowledge about locations of additional transform coefficients for the acquired image data within the wavelet transform domain includes weighing context information pertaining to an approximate initial set of transform coefficients,
wherein the context information includes parent coefficients of the initial set of transform coefficients that has already been found within the image data in the wavelet transform domain and a weighted sum of neighbor coefficients proximate to the initial set of transform coefficients that has already been found within the image data in the wavelet transform domain, and
wherein for each initial transform coefficient that has already been found, the parent coefficient is weighed equally, within the context information, with the sum of neighbor coefficients.

14. The method of claim 13, wherein proximity, for determining the locations proximate to where initial transform coefficients have already been found, is measured along diagonal orientation of subbands resulting from a decomposition of wavelet coefficients.

15. The method of claim 13, wherein the acquired image data is acquired using a magnetic resonance imager or a computed tomography imager.

16. The method of claim 13, wherein performing compressed sensing (CS) reconstruction is performed in conjunction with Iterative Hard Thresholding (IHT), Orthogonal Matching Pursuit (OMP), Iteratively Reweighted Least Squares (IRLS), or reweighted $l_1$ minimization (RL1).

17. A computer system comprising:
a processor; and
a non-transitory, tangible, program storage medium, readable by the computer system, embodying a program of instructions executable by the processor to perform method steps for constructing an image, the method comprising:
acquiring image data in a sensing domain;
transforming the acquired image data from the sensing domain into a wavelet transform domain in which the acquired image data exhibits a higher degree of sparsity than exhibited in the sensing domain;
approximating an initial set of transform coefficients for transforming the acquired image data from the wavelet transform domain into an image domain in which the image may be displayed by performing compressed sensing (CS) reconstruction;
updating the approximated initial set of transform coefficients based on context information pertaining to the approximate initial set of transform coefficients;
constructing an image in the image domain based on the updated set of transform coefficients; and
displaying the constructed image,
wherein the context information includes parent coefficients of the initial set of transform coefficients that has already been found within the image data in the wavelet transform domain and a weighted sum of neighbor coefficients proximate to the initial set of transform coefficients that has already been found within the image data in the wavelet transform domain, and
wherein for each initial transform coefficient that has already been found, the parent coefficient is weighed equally, within the context information, with the sum of neighbor coefficients.

18. The computer system of claim 17, wherein approximating the initial set of transform coefficients is performed using compressed sensing.

19. The computer system of claim 17, wherein the acquired image data is acquired using a magnetic resonance imager.

20. The computer system of claim 17, wherein performing compressed sensing (CS) reconstruction is performed in conjunction with Iterative Hard Thresholding (IHT), Orthogonal Matching Pursuit (OMP), Iteratively Reweighted Least Squares (IRLS), or reweighted $l_1$ minimization (RL1).

* * * * *